United States Patent
Varghese et al.

(10) Patent No.: US 11,222,956 B2
(45) Date of Patent: Jan. 11, 2022

(54) DISTRIBUTED CURRENT LOW-RESISTANCE DIAMOND OHMIC CONTACTS

(71) Applicants: Massachusetts Institute of Technology, Cambridge, MA (US); Board of Trustees of Michigan State University, East Lansing, MI (US)

(72) Inventors: Joseph Varghese, Woburn, MA (US); Timothy Grotjohn, Okemos, MI (US); Michael Geis, Acton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/844,907

(22) Filed: Apr. 9, 2020

(65) Prior Publication Data
US 2021/0320183 A1 Oct. 14, 2021

(51) Int. Cl.
*H01L 21/00* (2006.01)
*H01L 29/45* (2006.01)
*H01L 29/16* (2006.01)
*H01L 29/167* (2006.01)
*H01L 29/08* (2006.01)
*H01L 29/66* (2006.01)
*H01L 21/02* (2006.01)
*H01L 21/04* (2006.01)

(52) U.S. Cl.
CPC ........ *H01L 29/45* (2013.01); *H01L 21/02527* (2013.01); *H01L 21/02579* (2013.01); *H01L 21/042* (2013.01); *H01L 21/043* (2013.01); *H01L 21/0415* (2013.01); *H01L 29/0847* (2013.01); *H01L 29/1602* (2013.01); *H01L 29/167* (2013.01); *H01L 29/66045* (2013.01)

(58) Field of Classification Search
CPC ............... H01L 29/45; H01L 21/02527; H01L 21/02579; H01L 21/0415; H01L 21/042; H01L 21/043; H01L 29/0847; H01L 29/1602; H01L 29/167; H01L 29/66045
See application file for complete search history.

(56) References Cited

U.S. PATENT DOCUMENTS

| 5,254,862 | A | 10/1993 | Kalyankjumar et al. |
| 5,350,944 | A | 9/1994 | Geis et al. |
| 8,759,876 | B2 * | 6/2014 | Lu ........................ H01L 29/7787 257/194 |
| 9,922,791 | B2 | 3/2018 | Koeck et al. |
| 10,121,657 | B2 | 11/2018 | Koeck et al. |

(Continued)

OTHER PUBLICATIONS

U.S. Non-Final Office Action dated Jan. 28, 2021 for U.S. Appl. No. 16/573,187; 11 pages.

(Continued)

*Primary Examiner* — Richard A Booth
(74) *Attorney, Agent, or Firm* — Daly, Crowley, Mofford & Durkee, LLP

(57) ABSTRACT

In some embodiments, a semiconductor structure can include: a diamond substrate having a surface conductive layer; a heavily doped region formed in the diamond substrate; and a metal contact positioned over the conductive surface layer such that a first portion of the heavily doped region is covered by the metal contact and a second portion of the heavily doped region is not covered by the metal contact.

7 Claims, 6 Drawing Sheets

(56) References Cited

U.S. PATENT DOCUMENTS

| | | | |
|---|---|---|---|
| 10,418,475 | B2 | 9/2019 | Chowdhury et al. |
| 10,704,160 | B2 | 7/2020 | Koeck et al. |
| 2014/0319542 | A1 | 10/2014 | Kalish et al. |
| 2015/0187570 | A1 | 7/2015 | Haider et al. |
| 2016/0043260 | A1 | 2/2016 | Nemanich et al. |
| 2018/0182805 | A1 | 6/2018 | Park et al. |
| 2018/0204702 | A1 | 7/2018 | Koeck et al. |
| 2018/0212026 | A1* | 7/2018 | Fedynyshyn .......... C30B 33/00 |
| 2018/0366568 | A1* | 12/2018 | Huang .............. H01L 29/66045 |
| 2020/0119207 | A1 | 4/2020 | Holmes et al. |
| 2020/0343344 | A1 | 10/2020 | Koeck et al. |
| 2020/0388850 | A1 | 12/2020 | Park et al. |
| 2020/0403067 | A1 | 12/2020 | Kalish et al. |

OTHER PUBLICATIONS

Restriction Requirement dated Sep. 22, 2020 for U.S. Appl. No. 16/573,187; 6 pages.
Response to Restriction Requirement dated Sep. 22, 2020 for U.S. Appl. No. 16/573,187; Response filed on Oct. 26, 2020; 1 page.
U.S. Appl. No. 16/573,187, filed Sep. 17, 2019, Geis, et al.
Aguado et al., "Catalytic Conversion of Polyolefins into Liquid Fuels over MCM-41: Comparison with ZSM-5 and Amorphous $SiO_2$—$Al_2O_3$;" Article in Energy & Fuels , vol. 11, No. 6; Nov. 1997; pp. 1225-1231; 7 Pages.
Akhan Semiconductor Inc., "The Technology—The Case for Wide Bandgap Semiconductors;" Retrieved from https://www.akhansemi.com/technology.html on Jun. 6, 2019; 8 Pages.
Cappelluti, et al., "Investigating the Properties of Interfacial Layers in Planar Schottky Contacts on Hydrogen-Terminated Diamond Through Direct Current/Small-Signal Characterization and Radial Line Small-Signal Modelling;" Applied Physics Letters, vol. 106; Mar. 12, 2015; 6 Pages.
Corma, "Inorganic Solid Acids and Their Use in Acid-Catalyzed Hydrocarbon Reactions;" Article in Chemical Reviews, vol. 95, No. 3; May 1995; pp. 559-614; 56 Pages.
Crawford et al., "Thermally Stable, High Performance Transfer Doping of Diamond Using Transition Metal Oxides;" Article from Scientific Reports, No. 8; Published Feb. 20, 2018; 9 Pages.
Geis et al., "Chemical and Semiconducting Properties of $NO_2$-activated H-terminated Diamond;" Article from Diamond & Related Materials, vol. 84; Published Mar. 6, 2018; 9 Pages.
Geis et al., "Progress Toward Diamond Power Field-Effect Transistors;" Article in Physica Status Solidi, vol. 215, No. 22; Nov. 2018; 14 Pages.
Hewett, et al., "Specific Contact Resistance Measurements of Ohmic Contacts to Semiconducting Diamond;" Journal of Applied Physics, vol. 107; Jun. 4, 1998; 7 Pages.
Hirama et al., "Diamond Field-Effect Transistors with 1.3A/mm Drain Current Density by $Al_2O_3$ Passivation Layer;" Japanese Journal of Applied Physics, vol. 51; Published Aug. 9, 2012; 5 Pages.
Hirama et al., "Spontaneous Polarization Model for Surface Orientation Dependence of Diamond Hole Accumulation Layer and its Transistor Performance;" Article in Applied Physics Letters, vol. 92; Published Mar. 19, 2008; 3 Pages.
Hoffman et al., "Electrochemical Hydrogen Termination of Boron-doped Diamond;" Article in Applied Physics Letters, vol. 97; Published Aug. 4, 2010; 3 Pages.

Hu et al., "A New Sol-gel Route to Prepare Dense $Al_2O_3$ Thin Films;" Article in Ceramics International, vol. 42; Published Jul. 27, 2016; 5 Pages.
Johnson, "Diamond-based Semiconductors Take a Step Forward;" Retrieved from https://spectrum.ieee.org/; Published Jun. 1, 2016; 2 Pages.
Kardys, "High Performance Diamond Semiconductor Devices Coming Soon!—AKHAN's Miraj Diamond® Technology Granted Key Patents and Trademarks;" Article from Electronics 360 (https://electronics360.globalspec.com/); Published May 31, 2018; 2 Pages.
Khan, "Moore's Law and Moving Beyond Silicon: The Rise of Diamond Technology;" Article Retrieved from https://www.wired.com/insights/2015/01/the-rise-of-diamond-technology/; Published on Jan. 30, 2015; 6 Pages.
Macdonald, et al., "Performance Enhancement of $Al_2O_3$/H-Diamond MOSFETs Utilizing Vacuum Annealing and $V_2O_5$ as a Surface Electron Acceptor;" IEEE Electron Device Letters, vol. 39, No. 9; Sep. 2018; 4 Pages.
Marczewski et al., "Superacid Properties of $Al_2O_3$—$SbF_5$ Catalytic System;" Article from the Journal of Molecular Catalysis A: Chemical, vol. 97, Issue 2; Published Apr. 3, 1995; pp. 101-110; 10 Pages.
Mitchell, "Diamonds Vie to Replace Silicon as Next Semiconductor Material;" Article Retrieved from https://www.allaboutcircuits.com; Published Jan. 28, 2017; 5 Pages.
Nakabayashi, "Properties of Acid Sites on $TiO_2$—$SiO_2$ and $TiO_2$—$Al_2O_3$ Mixed Oxides Measured by Infrared Spectroscopy;" Article from Bulletin of the Chemical Society of Japan, vol. 65, No. 3; Jan. 1992; pp. 914-916; 3 Pages.
Nakanishi, et al., "Formation of Ohmic Contacts to p-type Diamond Using Carbide Forming Metals;" Journal of Applied Physics, vol. 76; Aug. 17, 1998; 7 Pages.
Nanowerk, "Diamonds—the Ultimate Semiconductors;" Article Retrieved from https://www.nanowerk.com/nanotechnology-news/newsid=45214.php; Article Published Nov. 29, 2016; 10 Pages.
Sabu et al., "A Comparative Study on the Acidic Properties and Catalytic Activities on $TiO_2$, $SiO_2$, $Al_2O_3$, $SiO_2$—$Al_2O_3$, $SiO_2$—$TiO_2$, $Al_2O_3$—$TiO_2$, and $TiO_2$—$SiO_2$—$Al_2O_3$;" Article from Bulletin of the Chemical Society of Japan, vol. 64, No. 6; Jul. 16, 1990; pp. 1920-1925; 6 Pages.
Sato et al., "High Hole Current Achievement of Hydrogen-Terminated Diamond MOSFETs Coated with Poly-tetra-fluoro-ethylene;" Conference Paper from Extended Abstracts of the 2010 International Conference on Solid State Devices and Materials; Sep. 2010; pp. 908-909; 2 Pages.
Satsuma et al., "Determination of the Acid Strength of Binary Oxide Catalysts Using Temperature-Programmed Desorption of Pyridine;" Article from the Bulletin of the Chemical Society of Japan; Dec. 12, 1996; pp. 1311-1317; 7 Pages.
Tsao et al., "Ultrawide-Bandgap Semiconductors: Research Opportunities and Challenges;" Article from Advanced Electronic Materials; Dec. 4, 2017; 49 Pages.
Verona et al., "Influence of Surface Crystal-orientation on Transfer Doping of $V_2O_5$/H-terminated Diamond;" Article from Applied Physics Letters, vol. 112; Published May 1, 2018; 5 Pages.
Yu et al., "A High Frequency Hydrogen-Terminated Diamond MISFET with $f_t/f_{max}$ of 70/80 GHz;" Article from IEEE Electron Device Letters, vol. 39, No. 9; Sep. 2018; 4 Pages.
Response to U.S. Non-Final Office Action dated Jan. 28, 2021 for U.S. Appl. No. 16/573,187; Response filed on Apr. 13, 2021; 9 pages.
Notice of Allowance dated Jul. 6, 2021 for U.S. Appl. No. 16/573,187; 10 pages.

* cited by examiner

DISTRIBUTED CURRENT LOW-RESISTANCE DIAMOND OHMIC CONTACTS

STATEMENT REGARDING FEDERALLY SPONSORED RESEARCH

This invention was made with Government support under Grant No. FA8702-15-D-0001 awarded by the U.S. Air Force. The Government has certain rights in the invention.

BACKGROUND

As is known in the art, semiconducting diamond can provide an order of magnitude increase in power handling over other semiconductor materials, such as silicon (Si), gallium arsenide (GaAs), and gallium nitride (GaN). This is made possible by diamond's higher thermal conductivity and a higher breakdown voltage than any device-quality semiconductor.

A diamond field-effect transistor (FET) can be made by forming a p-type surface conductive layer on the diamond surface. One approach to forming the p-type surface conductive layer is to terminate the diamond surface with hydrogen (H) atoms and then over-coat the H-terminated surface with a material that contains negative charge. Impressive current, voltage and operational frequencies have been demonstrated with such surface conductive FETs. However, with existing diamond FETs, device operation may be limited by the resistance of the surface layer and the inherent resistance between the surface conductive layer and metal contacts to the semiconductor. Such ohmic contacts may be likely to degrade, exhibit increasing resistance and burn out at high currents, e.g., currents >0.5 A mm$^{-1}$. In addition, contacts exhibiting lower contact resistances (e.g., contacts <3 Ω-mm using Au or Pt) generally do not adhere well to the diamond surface and may not be suitably robust for device processing and fabrication.

SUMMARY

Disclosed herein are embodiments of a diamond semiconductor structure that has low resistance (e.g., ~0.50 Ω-mm) important for high power diamond transistors. The current flowing in and out of the ohmics does not suffer from current crowding common to other metal ohmics on diamond. This makes the ohmics more robust and results in higher reliability for devices subjected to high temperatures and high operational current. Also disclosed are methods for fabricating robust low-resistance contacts suitable for high-frequency operation of diamond FETs. Embodiments of the present disclosure have experimentally yielded DC power density of 200 W/mm without the use of heat-sinks. Embodiments of the present disclosure can be used in high-frequency, high-power applications, such as power radio frequency (RF) amplifiers.

According to one aspect of the present disclosure, a semiconductor structure can include: a diamond substrate having a surface conductive layer; a heavily doped region formed in the diamond substrate; and a metal contact positioned over the conductive surface layer such that a first portion of the heavily doped region is covered by the metal contact and a second portion of the heavily doped region is not covered by the metal contact.

In some embodiments, the surface conductive layer may include: an H-terminated surface of the diamond substrate; and a material that contains negative charge. In some embodiments, the heavily doped region may include diamond doped with Boron in a concentration greater than $10^{19}$ cm$^{-3}$. In some embodiments, the heavily doped region can have a width in the range of 0.1 to 10 µm and a depth in the range 0.2 to 0.4 µm. In some embodiments, the heavily doped region may have a width greater than 10 µm. In some embodiments, the metal contact can include at least one of Molybdenum (Mo), Tungsten (W), Titanium (Ti), or Tantalum (Ta), or other carbide forming material. In some embodiments, the metal contact may include a plurality of metal layers, wherein the plurality of metal layers includes an interface layer in contact with the heavily doped region and a bonding layer for contact with wire. In some embodiments, the interface layer can include Molybdenum (Mo) and the bonding layer comprises Gold (Au).

According to another aspect of the present disclosure, a method can include: applying a mask over a surface of a diamond substrate; forming one or more highly doped regions in the diamond substrate using the mask; removing the mask from the surface of the diamond substrate; depositing metal over the surface of the diamond substrate such that, for each of the one or more highly doped regions, a first portion of the heavily doped region is covered by the metal and a second portion of the heavily doped region is not covered by the metal; and forming a conductive layer at the surface of the diamond substrate.

In some embodiments, applying the mask over the surface of a diamond substrate can include etching the surface of the diamond substrate. In some embodiments, forming the one or more highly doped regions can include growing diamond doped with Boron. In some embodiments, depositing the metal can include depositing at least one of Molybdenum (Mo), Tungsten (W), Titanium (Ti), or Tantalum (Ta), or other carbide forming material. In some embodiments, forming the conductive layer at the surface of the diamond substrate can include: terminating the surface of the diamond substrate with Hydrogen (H) atoms; and overcoating the H-terminated surface with a protective material. In some embodiments, forming the one or more highly doped regions can include forming a first highly doped region corresponding to a drain of a field-effect transistor (FET) and forming a second highly doped region corresponding to a source of the FET. The method can further include depositing a gate on the conductive layer.

BRIEF DESCRIPTION OF THE DRAWINGS

Various objectives, features, and advantages of the disclosed subject matter can be more fully appreciated with reference to the following detailed description of the disclosed subject matter when considered in connection with the following drawings, in which like reference numerals identify like elements.

The drawings are not necessarily to scale, or inclusive of all elements of a system, emphasis instead generally being placed upon illustrating the concepts, structures, and techniques sought to be protected herein.

DETAILED DESCRIPTION

Figure 1:
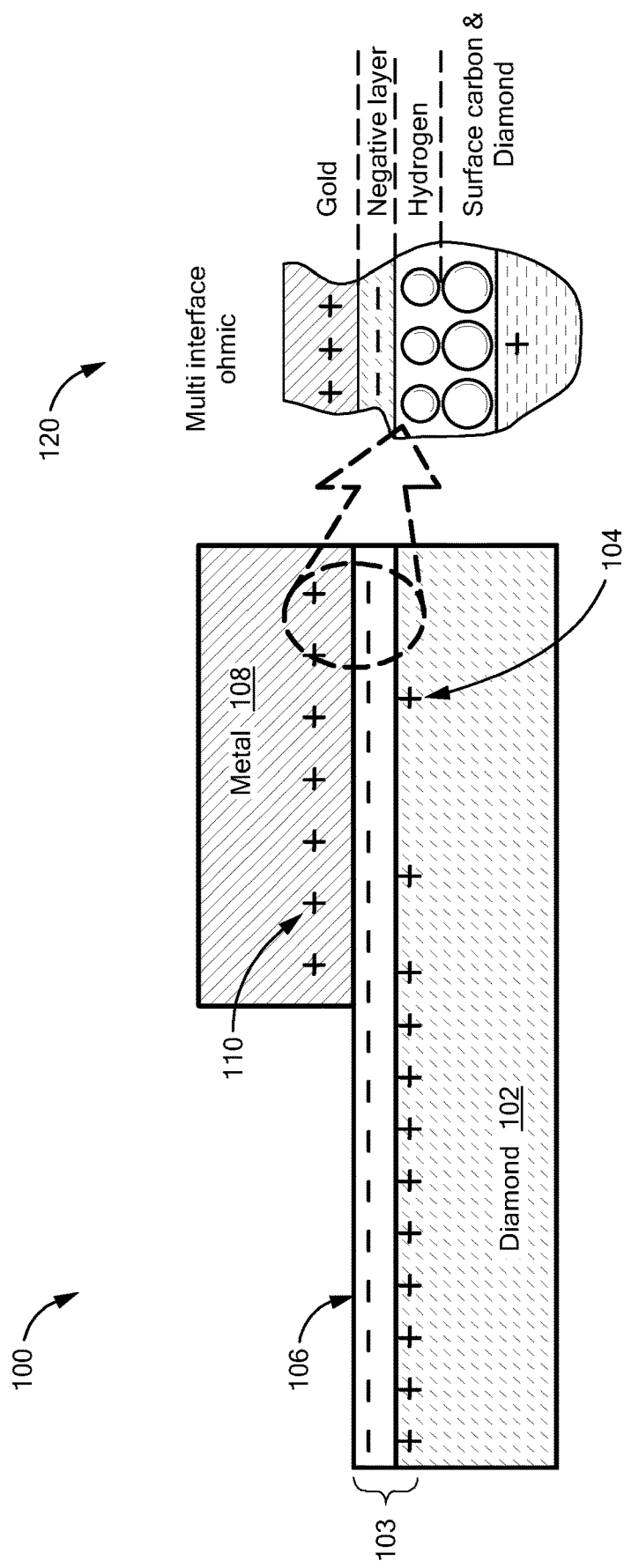
FIGS. 1 and 1A are schematic diagrams of a prior art diamond semiconductor structure.
Figure 1A:
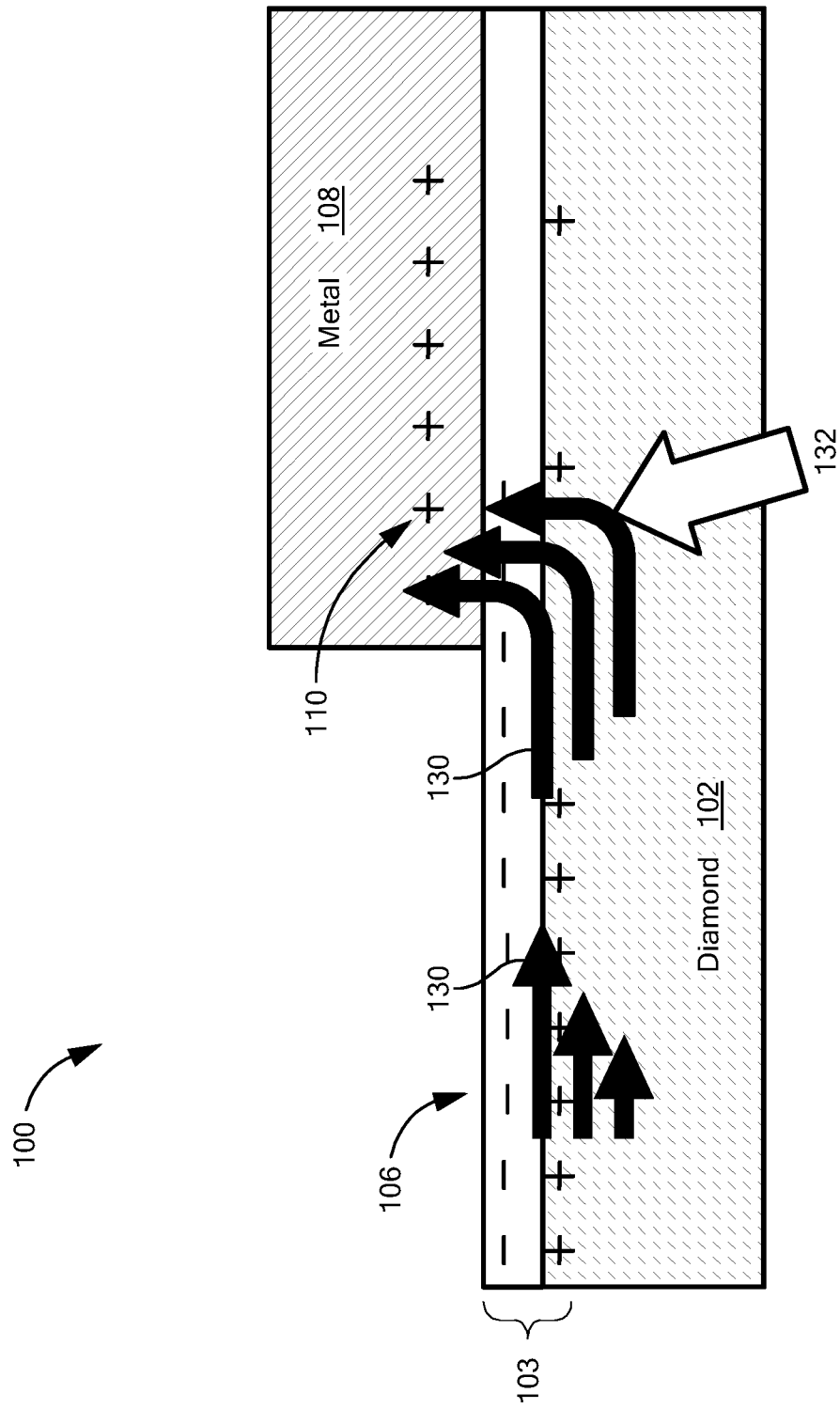

FIGS. 1 and 1A show a diamond semiconductor structure 100 as may be found in the art. The illustrative structure 100 includes a diamond substrate 102 having a p-type conductive surface layer 103. The conductive layer 103 may be formed by terminating the diamond surface with Hydrogen (H) atoms to cause positive charge 104 on the diamond surface, and then over-coating the H-terminated diamond with a material that contains negative charge 106. That is, a negative charge is formed on the diamond surface that compensates the positive charge, holes, in the diamond.

Ohmic contacts may be formed on the diamond substrate 102 by depositing a metal 108 having a high electron work function (e.g., a metal having an electron work function >5 eV). Examples of such metals 108 include Gold (Au), Platinum (Pt), and Palladium (Pd). When such a metal is deposited on the diamond conductive surface layer 103, the surface resistance may be substantially increased (e.g., by up to 200 times). This is the result of positive image charges 110 that appear in the metal 108 and reduce the carrier density of the surface conductive layer 103.

It is appreciated herein that the makeup and design of existing diamond semiconductors structures, such as structure 100 of FIG. 1, can reduce ohmic conductivity and compromise the reliability of semiconductor devices (e.g., FETs) within which they are used. For example, referring to callout 120 of FIG. 1, current passing between the metal 108 (e.g., Gold) and the diamond 102 must pass though several layers of material and interfaces, which can reduce ohmic conductivity and compromise the reliability of devices using the structure 100.

As shown in FIG. 1A, due to the relatively high resistance under the metal ohmic contact 108, when current 130 passes between the diamond 102 and the metal 108, the current 130 will tend to crowd in a relatively small region 132 where the metal edge contacts the diamond surface. The size of the crowding region 132 may be determined by the thickness of the surface conducting layer 103 and, in some examples, may have a dimension of a few nanometers. Such crowding can compromise device reliability and performance.

Figure 2:
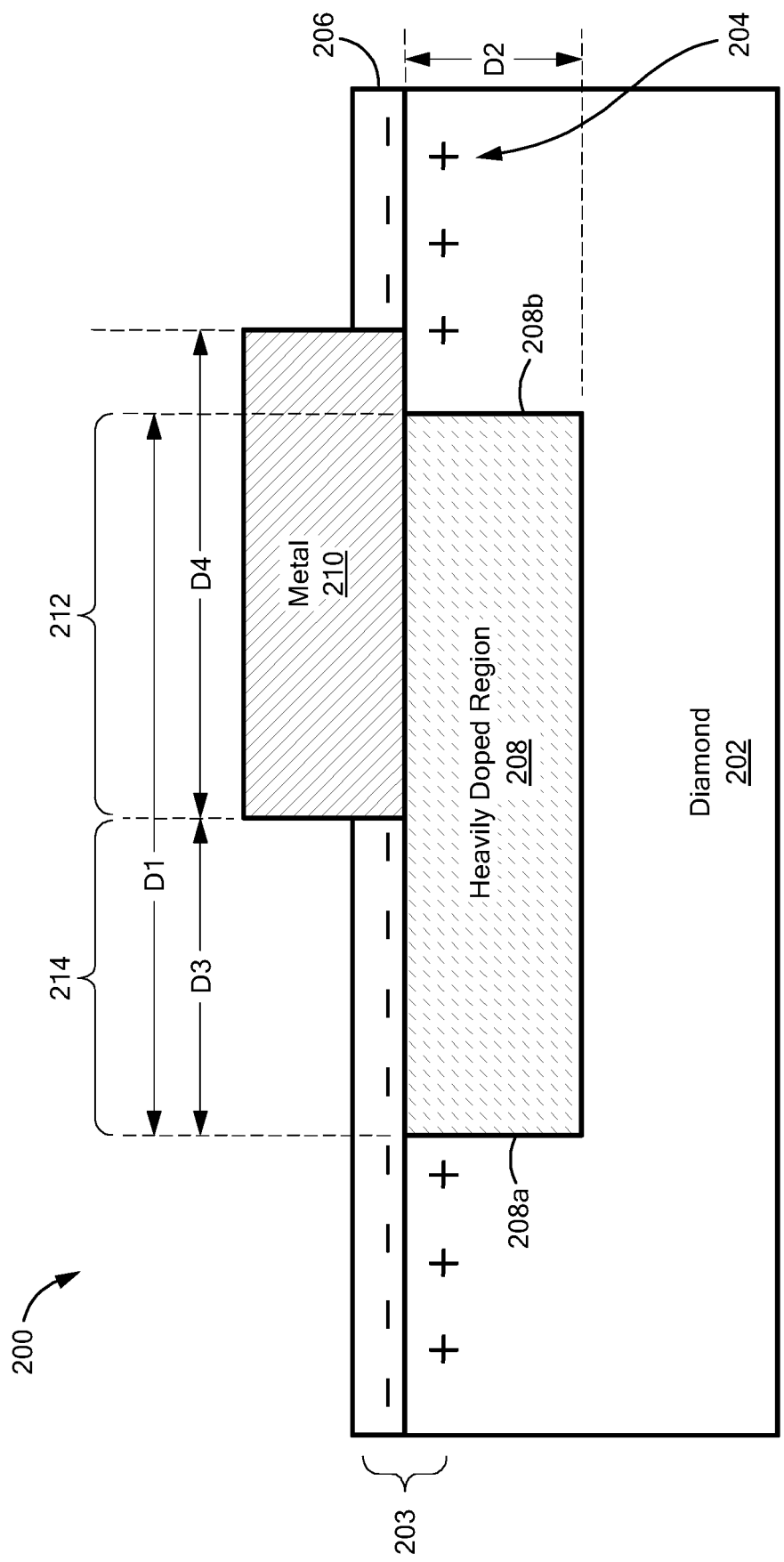
FIGS. 2 and 2A are schematic diagrams of a diamond semiconductor structure having distributed-current ohmic contact, according to some embodiments of the present disclosure.
Figure 2A:
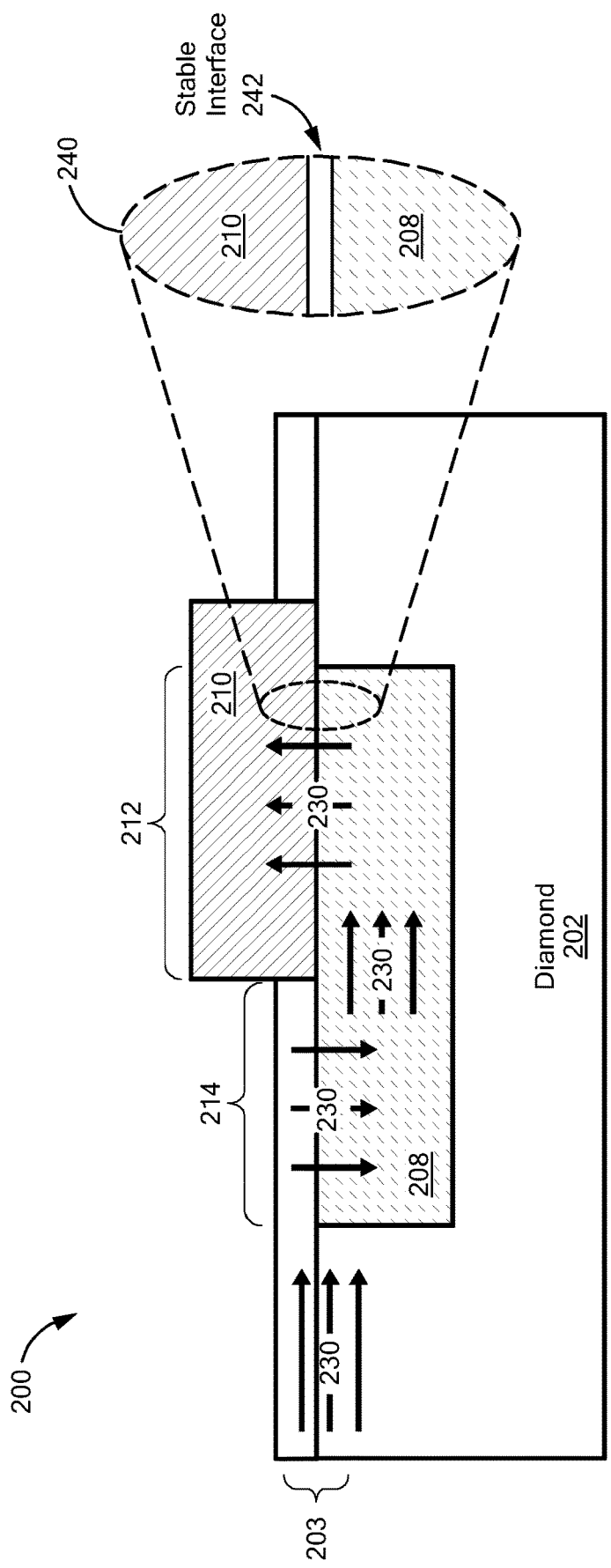

FIGS. 2 and 2A show a diamond semiconductor structure 200 having distributed-current ohmic contact, according to embodiments of the present disclosure. The illustrative structure 200 includes a diamond substrate 202 having a p-type conductive surface layer 203. The conductive layer 203 may be formed by terminating the diamond surface with H atoms to cause positive charge 204 on the diamond surface, and then over-coating the H-terminated diamond with a material that contains negative charge 206. Commonly used over-coating materials include $Al_2O_3$ or an oxide mixture of $Al_2O_3$ and $SiO_2$ deposited by atomic layer deposition, ALD. With other diamond transistor fabrication schemes the over-coating may include transition metal oxides like $WO_3$, $MoO_3$ or $V_2O_3$, deposited by thermal evaporation. Over-coatings typically vary in thickness from 1 to 100 nm depending on the application for which the transistor is designed.

A heavily doped region 208 may be formed along a portion of the conductive surface layer 203. The heavily doped region 208 may be a region of the diamond that is doped with Boron in a concentration greater than $10^{19}$ $cm^{-3}$. As illustrated in FIG. 2, heavily doped region 208 can have width D1 measured from a first edge 208a to a second edge 208b, and a depth D2 measured from the top surface of diamond substrate 202. In some embodiments, heavily doped region 208 may have a width D1 of about 0.1 to 2 μm. In some embodiments, heavily doped region 208 may have a depth D2 in the range 0.2 to 0.4 μm. A procedure for forming heavily doped region 208 is described below in the context of FIG. 3.

A metal contact 210 may be provided over the conductive surface layer 203 and positioned at least partly over the heavily doped region 208. Metal contact 210 can include a metal that is robust in terms of device processing and that can achieve sufficiently low-resistance contact (e.g., <1 Ω-mm) with the heavily doped material 208. In some embodiments, metal contact 210 can include Molybdenum (Mo), Tungsten (W), Titanium (Ti), Tantalum (Ta), or another carbide forming material. In some embodiments, metal contact 210 can have a width D4 of about 0.1 μm to greater than 10 μm.

The metal contact 210 may be offset by a distance D3 from first edge 208a of the heavily doped region 208. That is, metal contact 210 may be positioned over heavily doped region 208 such that a first portion 212 of the heavily doped region is covered by metal contact 210, whereas a second portion 214 of the heavily doped region is not covered by metal contact 210. While the example of FIG. 2 shows metal contact 210 as being offset from first edge 208a of the heavily doped region (e.g., from the left edge in FIG. 2), in other examples metal contact 210 can be offset from second/right edge 208b of the heavily doped region. In some embodiments, the offset distance D3 may be in the range 0.1 to 2 μm.

The contact between the surface conductive layer 203 and the heavily doped region 208 may be over a comparatively large area, resulting in a negligible resistance. The area of the heavily doped region 208 may be large enough to make electrical contact to metal contact 210, while allowing a portion to remain metal-free to make contact to conductive surface layer 203. This metal-free portion of 208, characterized by the offset distance D3, should have a width of 0.1 to 2 μm, while the metal-covered portion of 208, characterized by the distance obtained by subtracting D3 from D1, should be 0.1 μm or greater. As illustrated in FIG. 2A, current 230 flowing across the surface conductive layer 203 can flow into the heavily doped region 208 across second portion 214 not covered by metal contact 210. Current 230 can flow through heavily doped region 208 and into metal contact 210 across first portion 212. Thus, the illustrative structure 200 provides a so-called "two-stage" ohmic contact from surface conductive layer 203 to metal contact 210 via the heavily doped region 208. At each "stage," ohmic contact is distributed over a relatively large area to prevent current crowding. In particular, contact between surface conductive layer 203 and heavily doped region 208 is distributed over an area corresponding to second portion 214, and contact between heavily doped region 208 and metal contact 210 is distributed over an area corresponding to first portion 212. As such, embodiments of the semiconductor structure disclosed herein can mitigate the problem of current crowding found in the prior art.

Referring to FIG. 2A, callout 240 shows an expanded region between the metal 210 and the heavily doped diamond region 208. Current passing between the metal contact 210 and the doped diamond 208 passes through a relatively thin layer of material 242. In some embodiments, the pass-through layer 242 may have a thickness in the range of 2 nm to 100 nm. The element used within metal contact 210 and the element used to dope the diamond region 208 may be selected such that the pass-through layer 242 has sufficiently low resistance (e.g., ~0.50 Ω-mm), while being both chemically and thermally stable. For example, metal contact 210 may include Molybdenum (Mo), heavily doped region 208 may include Boron-doped diamond, and the resulting pass-through layer 242 may be Molybdenum Carbide ($Mo_2C$). As discussed below in the context of FIG. 4E, $Mo_2C$ can result from a so-called "slow annealing" process.

Figure 3:
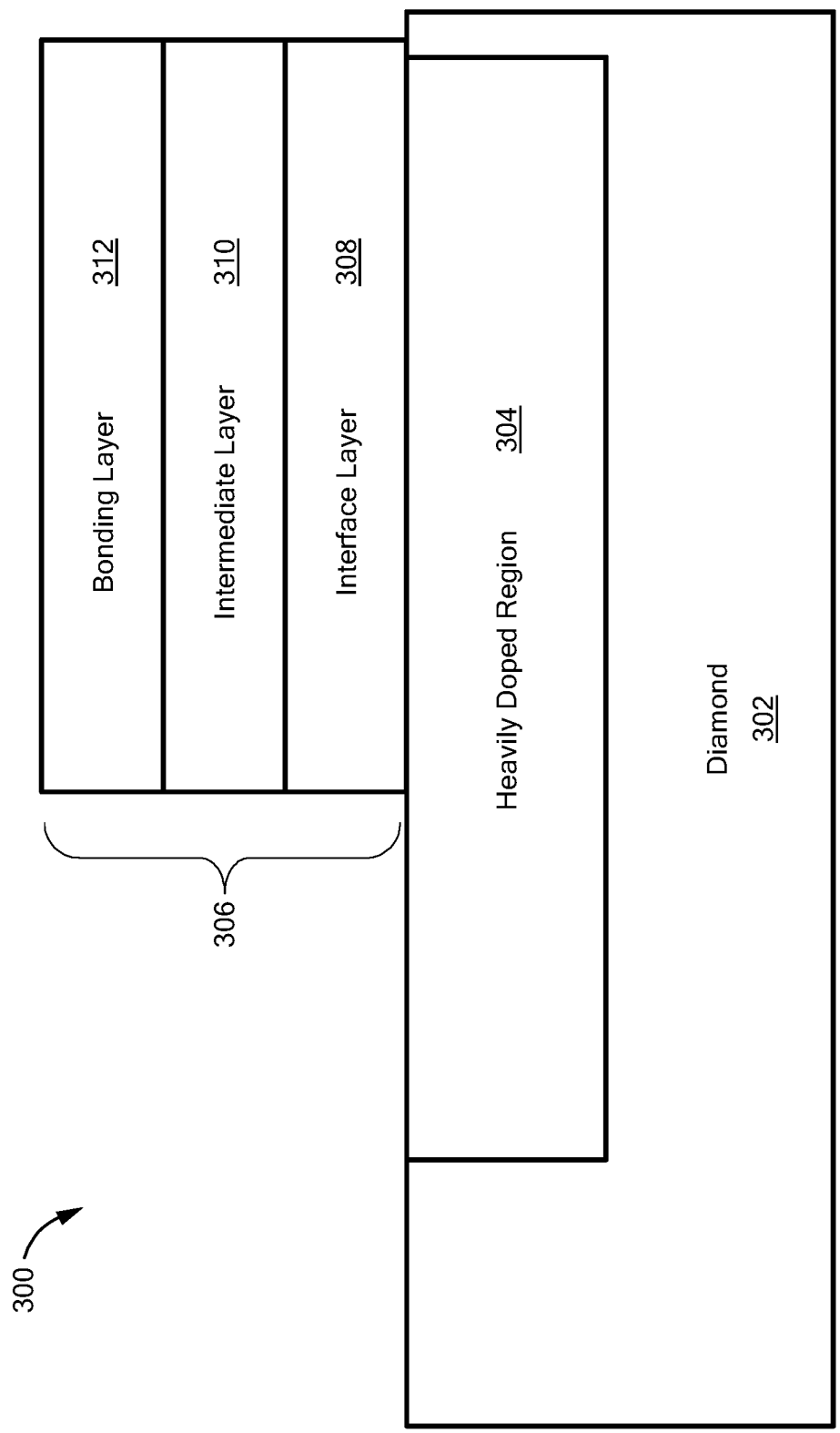
FIG. 3 is a schematic diagram of another diamond semiconductor structure having distributed-current ohmic contact, according to some embodiments of the present disclosure.

Referring to FIG. 3, a semiconductor structure 300 can include a diamond substrate 302, a heavily doped region 304 (e.g., Boron-doped diamond), and a metal contact 306. The metal contact 306 may be positioned over a portion of (but not all of) heavily doped region 304 to provide distributed ohmic contact as previously discussed. The metal contact 306 can include an interface layer 308 in contact with the heavily doped region 304, an intermediate layer 310, and a bonding layer 312 for bonding to wires or other semiconductor devices. In some embodiments, interface layer 308 may be comprised of Molybdenum (Mo) or another carbide forming metal that contributes to robust electrical and mechanical contact to diamond. In some embodiments, intermediate layer 310 may be comprised of Titanium (Ti) or another adhesive metal that promotes adhesion between bonding layer 312 and interface layer 308. In some embodiments, bonding layer 312 may be comprised of Gold (Au). It is appreciated herein that Au provides good connectivity to wires/devices, Au adheres well to Ti and other highly adhesive metals, and Mo adheres to and forms a carbide with diamond that is both highly conductive and mechanically adherent.

FIGS. 4A to 4F show a process for fabricating a metal-oxide-semiconductor field-effect transistor (MOSFET) having distributed-current ohmic contacts, according to some embodiments. The process includes forming distributed ohmic contacts to the surface conductive layer of H-terminated diamond.

Figure 4D:
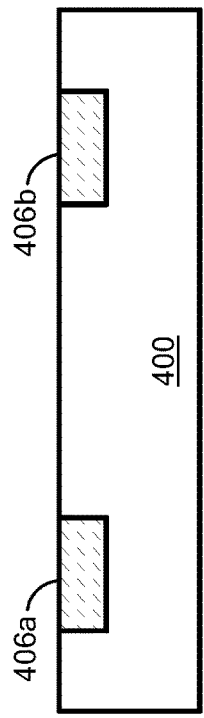
FIGS. 4A to 4F are a series of diagrams showing a process for fabricating a metal-oxide-semiconductor field-effect transistor (MOSFET) having distributed-current ohmic contacts, according to some embodiments of the present disclosure.
Figure 4E:
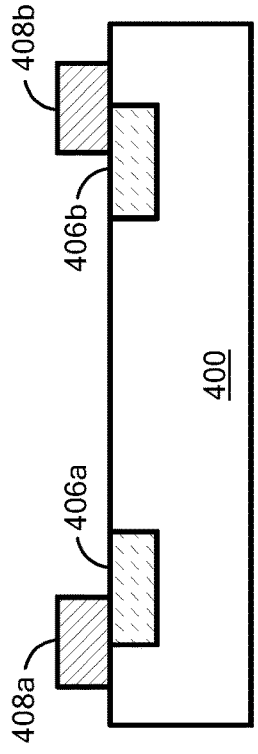
Figure 4F:
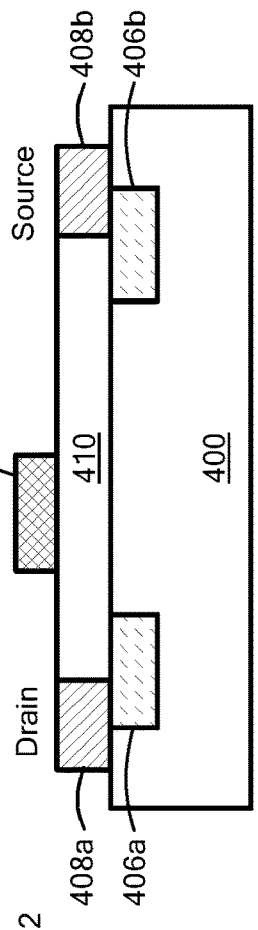
Figure 4A:
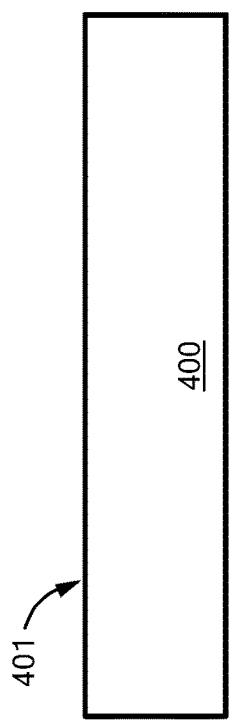

The process can start at FIG. 4A, with diamond substrate 400. The diamond substrate 400 may have a planar top surface 401. The top surface 401 may be cleaned by using acid-based solutions such as $H_2SO_4$:$H_2O_2$ (2 parts sulfuric acid to 1 part hydrogen peroxide) or $H_2SO_4$:$HNO_3$ (2 parts sulfuric acid to 1 part nitric acid) in which the ratios of the constituent acids need not be restricted to the given examples, but can be changed as desired. The solutions can also be heated to temperatures of about 100° C. or more to improve the efficacy of the clean.

Figure 4B:
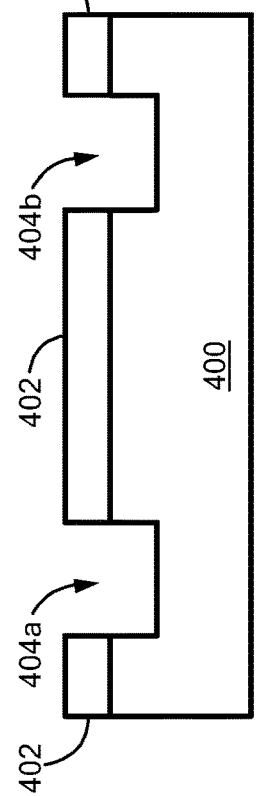

At FIG. 4B, a mask 402 may be applied over the top surface of the diamond 400. The mask 402 may be applied to cover all (or most) of diamond surface except for regions where heavily doped regions are to be formed. In the case of a MOSFET, this may include a region 404a corresponding to the drain and a second region 404b corresponding to the source. The mask can include a material that is thermally stable on diamond, such as $SiO_2$, $Si_3N_4$, Re, Cu, or carbonized photoresist. In some embodiments, regions 404a, 404b may correspond to voids in the top surface of the diamond substrate 400 formed using an etching technique.

Figure 4C:
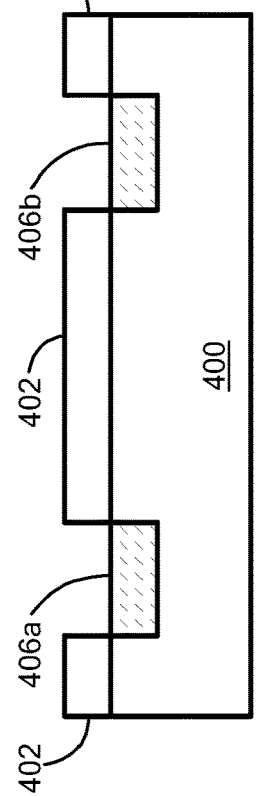

At FIG. 4C, heavily doped regions 406a, 406b may be formed using, for example, an epitaxial growth technique. That is, heavily doped diamond may be selectively grown in void regions 404a, 404b. In some embodiments, regions 406a, 406b may be doped with Boron in a concentration greater than $10^{19}$ $cm^{-3}$. In other embodiments, a boron ion implantation can be used instead of epitaxial growth.

At FIG. 4D, the mask can be removed to leave behind heavily doped regions 406a, 406b. In some embodiments, an acid-based etching process may be used to remove the mask.

At FIG. 4E, metal 408a, 408b (408 generally) may be deposited over heavily doped regions 406a, 406b, respectively. Metal 408 may include a metal known to make low resistive contacts to heavily doped diamond, such as Mo, W, Ti, Ta, or another carbide forming material. The metal 408 is deposited to leave some portion of the heavily doped regions 406a, 406b free of metal and available for contact to the diamond conductive surface layer (which is formed by H-terminating the top surface of the diamond 400, as described below). After the metal 408 is deposited, the semiconductor structure may be annealed. In some embodiments, a capping layer of $Si_3N_4$, $SiO_2$, or other suitable material can be deposited before the annealing step to protect the deposited metal 408 during annealing.

In some embodiments, a so-called "slow annealing" technique can be used. For example, the semiconductor structure may be placed in an inert atmosphere such as nitrogen, argon, or other suitable atmosphere, or in a hydrogen atmosphere to further promote carbidization, for at least 30 minutes at about 950° C. Such an annealing process can result in a stable interface between the heavily doped diamond regions 406a, 406b and metal 408a, 408b, respectively. In some embodiments, as a result of annealing, a layer of Molybdenum Carbide ($Mo_2C$) may form between the heavily doped regions and the metal.

At FIG. 4F, the diamond 400 can be H-terminated and overcoated with a protective material 410 such as $Al_2O_3$ or an oxide mixture of $Al_2O_3$ and $SiO_2$ or another suitable material, that can maintain a surface conductive layer. Metal contacts 408a and 408b may be left exposed to provide a drain and a source, respectively. A metal 412 can be deposited over the protective material 410 to provide a gate. Thus, the procedure described herein can be used to provide an operational FET. Additional processing steps may be added for electrical isolation of the FET from other structures on the diamond substrate 400. In some embodiments, the diamond 400 may be H-terminated before or during formation of the heavily doped regions 406a, 406b.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

The invention claimed is:

1. A semiconductor structure comprising:
   a diamond substrate having a surface conductive layer, the surface conductive layer comprising an H-terminated surface of the diamond substrate and a material that contains negative charge;
   a heavily doped region formed in the diamond substrate; and
   a metal contact positioned over the conductive surface layer such that a first portion of the heavily doped region is covered by the metal contact and a second portion of the heavily doped region is not covered by the metal contact.

2. The structure of claim 1, wherein the heavily doped region comprises diamond doped with Boron in a concentration greater than $10^{19}$ cm$^{-3}$.

3. The structure of claim 1, wherein the heavily doped region has a width in the range of 0.1 to 10 μm and a depth in the range 0.2 to 0.4 μm.

4. The structure of claim 1, wherein the heavily doped region has a width greater than 10 μm.

5. The structure of claim 1, wherein the metal contact comprises at least one of Molybdenum (Mo), Tungsten (W), Titanium (Ti), or Tantalum (Ta), or other carbide forming material.

6. The structure of claim 1, wherein the metal contact comprises a plurality of metal layers, wherein the plurality of metal layers includes an interface layer in contact with the heavily doped region and a bonding layer for contact with wire.

7. The structure of claim 6, wherein the interface layer comprises Molybdenum (Mo) and the bonding layer comprises Gold (Au).

* * * * *